United States Patent [19]
Pascucci

[11] Patent Number: 5,864,513
[45] Date of Patent: Jan. 26, 1999

[54] SYSTEM FOR DETERMINING THE PROGRAMMED/NON PROGRAMMED STATUS OF A MEMORY CELL

[75] Inventor: Luigi Pascucci, Sesto San Giovanni, Italy

[73] Assignee: SGS-Thomson Microelectronics S.r.l., Agrate Brianza, Italy

[21] Appl. No.: 827,409

[22] Filed: Mar. 27, 1997

[30] Foreign Application Priority Data

Mar. 29, 1996 [EP] European Pat. Off. .............. 96830163

[51] Int. Cl.$^6$ .................................................. G11C 13/00
[52] U.S. Cl. .......................................... 365/210; 365/207
[58] Field of Search .............................. 365/189.01, 207, 365/210, 200, 230.01

[56] References Cited

U.S. PATENT DOCUMENTS

| | | | |
|---|---|---|---|
| 5,040,148 | 8/1991 | Nakai ....................................... | 365/210 |
| 5,245,574 | 9/1993 | Frary et al. .............................. | 365/189 |
| 5,305,273 | 4/1994 | Jinbo ....................................... | 365/210 |

FOREIGN PATENT DOCUMENTS

A-0 347 909  12/1989  European Pat. Off. ........ G11C 17/00

OTHER PUBLICATIONS

European Search Report from European Patent Application 96830163.0, filed Mar. 29, 1996.

IEEE International Solid State Circuits Conference, vol. 34, Feb. 1991, New York, US, pp. 264–265 S. Sweha, et al. "A 29ns 8Mb EPROM With Dual Reference–Column ATD Sensing".

*Primary Examiner*—Terrell W. Fears
*Attorney, Agent, or Firm*—Wolf, Greenfield & Sacks, P.C.

[57] ABSTRACT

A system for determining the programmed/non-programmed status of a memory cell includes a first branch for connecting a first load and a memory cell matrix and a second branch for connecting a second load and at least one virgin reference memory cell. A circuit for selecting a memory cell of the memory matrix and a circuit for selecting at least one virgin reference cell are included. Each one of the first and second branches has a transistor for enabling a flow of current, respectively, between the first load and the second load and the memory cell matrix and the at least one reference memory cell. The enabling transistors are controlled, respectively, by a first biasing structure and by a second biasing structure. The system includes at least one transistor for redistributing the current of the load on the first branch, which is connected in parallel to the enabling transistor, and a first equalization transistor that is controlled by a precharge signal for the equalization of opposite nodes of the first and second branches. The at least one current redistribution transistor provides a current imbalance in the first load and in the second load in order to sense a difference in conductivity between a memory cell of the memory matrix and the at least one reference cell in order to determine the programmed or non-programmed status of the memory cell of the memory matrix.

33 Claims, 12 Drawing Sheets

SYSTEM FOR DETERMINING THE PROGRAMMED/NON PROGRAMMED STATUS OF A MEMORY CELL

BACKGROUND OF THE INVENTION

1. Field of the Invention

The present invention relates to a reference system for determining the programmed/non-programmed status of a memory cell, particularly for non-volatile memories.

2. Discussion of the Related Art

In non-volatile memories, such as for example EPROMs, EEPROMs, and FLASH memories, each memory cell can be in only one of two possible conditions: programmed or non-programmed (virgin). Conductivity characteristics of the memory cells are related to these two conditions.

There are no intermediate conditions of the memory cells with conductivity characteristics interpolated between a conductivity level of a programmed cell and that of a non-programmed cell, so as to be able to use this intermediate conductivity as a reference to determine whether a particular memory cell is programmed or non-programmed. Therefore, it is necessary to plot a curve for distinguishing between the two conductivity levels of the memory cell. Various circuital techniques, developed to provide a reference that allows one to determine the status of a memory cell, are commonly known.

The two most common systems are the current mirroring system, with a 2:1 and 3:1 ratio, and the so-called "current offset" system; these systems are shown in FIG. 1 (with details in FIGS. 2 and 3) and in FIG. 4. The charts with the conductivity curves related to these systems are shown, for the sake of reference, respectively in FIGS. 25 and 26.

FIG. 1 illustrates a current mirroring system with a 2:1 ratio, characterized by a circuit that includes a first branch, or matrix branch, and a second branch, or reference branch. The first branch connects a load 1 to a matrix of memory cells from which, by a multiplexer selection circuit YM and YN, a memory cell 4 of the memory matrix is selected. The second branch connects a load 1' to a matrix of virgin reference memory cells, from which one virgin reference memory cell 4' is selected by multiplexer selection circuit YM, YN. Transistors 2 and 2' enable the flow current from the loads 1 and 1' to the memory cells 4 and 4' and are arranged in the first branch, and in the second branch respectively. Biasing structures 3 and 3' are provided to bias the transistors 2 and 2', respectively.

FIG. 2 shows, in more detail, the loads 1 and 1', in the case of a 2:1 current mirroring ratio, wherein the load 1 is constituted by a single transistor and the load 1' is constituted by two transistors. The current of the reference memory cell 4', designated by Icell, is mirrored in the load transistors and a current equal to Icell/2 flows in the first branch.

If the memory cell 4 is virgin (like the reference memory cell 4' in which the current Icell flows), an output node provided on the matrix branch becomes low, since the load does not deliver the current that the reference memory cell 4' allows to pass, i.e, Icell. The load 1 in fact delivers only the current Icell/2.

If instead the memory cell 4 is programmed (i.e., off), the output node of the matrix branch becomes high, since even if the current Icell/2 is weak, it causes the node to become high, since the memory cell 4 is off because it is programmed.

This characteristic can be defined by a conductivity curve for the memory cell 4, to be compared with a conductivity curve of the virgin reference memory cell 4'.

In summary, therefore, if a current Im on the matrix branch is Im=0 (the cell is off and programmed), a current on the reference branch Ir is equal to ½ a current Iv of the virgin memory cell 4' for each mirroring transistor. When balancing occurs, if Im=½ Iv and Ir=½ Iv, then the state of the memory cell 4 cannot be determined. Finally, if the memory cell 4 is virgin (Im=Iv), then the current on the reference branch is Ir=Iv/2.

FIG. 3 shows in detail the loads 1 and 1' in the case of a 3:1 mirroring ratio, in which the load 1 is again constituted by a single transistor, whereas the load 1' is constituted by three transistors. The cell current, designated by Icell, is mirrored in the load transistors, and a current equal to Icell/3 flows in the matrix branch.

As in the previous case, the following relations occur in the case of a memory cell when it is programmed, when balancing occurs, and when it is virgin:

programmed: Im = 0 Ir = ⅓Iv for each mirroring transistor
balanced: Im = ⅓Iv Ir = ⅓Iv for each mirroring transistor
virgin: Im = Iv Ir = ⅓Iv for each mirroring transistor The purpose of the circuit shown in FIG. 1 is to create a curve of the conductivity of a reference memory cell 4' as a function of the voltage. In this manner it is possible to compare the conductivity curve of the memory cell 4 whose status must be determined with respect to the reference curve.

Therefore, if one finds that the examined memory cell 4 allows the same current as a reference cell to pass, then it is a virgin cell; otherwise it is a programmed cell.

The reference curve thus created has the drawback that for low voltage values it has very low current difference values with respect to the actual conductivity curves of memory cells and therefore accurate determination of their status is difficult.

Furthermore, for high voltage values, the reference curve and the conductivity curve intersect, causing incorrect cell status determination.

The 3:1 mirroring circuit allows one to plot another conductivity curve that is lower than the first one so as to more assuredly detect the status of a cell that might be only weakly programmed and which cannot be determined with the first above mentioned reference curve.

This last curve allows one to provide a "margin" for reading during a verify step after programming, in order to ensure the normal reading that is performed with a 2:1 ratio.

The chart of the curves of this first reference system is shown in FIG. 25.

FIG. 4 shows a so-called "current offset" reference system, in which current mirroring is performed at the level of the bit lines.

The drawbacks of these known reference systems are the poor symmetry of the loads, the difficulty in biasing propagation, and higher current consumption caused by the current offset.

The chart with the curves of this reference system is shown in FIG. 26.

A lack of symmetry at the loads is a problem when using sense amplifiers of the dynamic latch type that require perfect balancing.

Furthermore, the vector of the current difference between the matrix current and the current of the reference branch, Im−Ir, in the most favorable conditions, is never higher than Iv/2.

Another drawback is due to the fact that both of the reference systems are difficult to implement in architectures in which the roles of the reference and matrix branches are reversed.

SUMMARY OF THE INVENTION

An aim of the present invention is therefore to provide a reference system for determining the programmed/non-programmed status of a memory cell, particularly for non-volatile memories, that outputs a current variation that is amplified with respect to the current variation of the cell, so as to assuredly detect the status of the memory cell.

Within the scope of this aim, an object of the present invention is to provide a reference system for determining the programmed/non-programmed status of a memory cell that is balanced as regards the loads, thus providing perfect symmetry.

Another object of the present invention is to provide a reference system for discriminating the programmed/non-programmed status of a memory cell that allows reversing the side taken as a reference with the memory matrix side that contains the memory cell whose status is to be determined.

Another object of the present invention is to provide a reference system for determining the programmed/non-programmed status of a memory cell that outputs a vector, representing the difference between the matrix current and the reference current, that is approximately twice the vector obtained with the conventional solution.

Another object of the present invention is to provide a reference system for determining the programmed/non-programmed status of a memory cell that does not have current mirrors provided in mutually distant locations, which entail propagation problems.

Another object of the present invention is to provide a reference system for determining the programmed/non-programmed status of a memory cell that reduces the consumption of current with respect to the conventional solution.

Another object of the present invention is to provide a reference system that is highly reliable and relatively easy to produce at competitive costs.

This aim, these objects, and others which will become apparent hereinafter are achieved by, in one embodiment, a reference system for determining the programmed/non-programmed status of a memory cell, particularly for non-volatile memories, which comprises: a first branch for connecting a first load and a memory cell matrix; a second branch for connecting a second load and at least one virgin reference memory cell; means for selecting a memory cell of said matrix of memory cells; and means for selecting said at least one virgin reference cell. Each one of said first and second branches includes a transistor for enabling the flow of current, respectively, between said first load and said second load and said memory cell matrix and said at least one reference memory cell. The enabling transistors are controlled, respectively, by a first biasing structure and by a second biasing structure. The reference system includes at least one transistor for redistributing the current of the load on said first branch, which is connected in parallel to said first enabling transistor, and a first equalization transistor that is controlled by a precharge signal for the equalization of opposite nodes of said first and second branches. The said at least one current redistribution transistor provides a current imbalance in said first and second loads to sense the difference in conductivity between a memory cell of said memory matrix and said at least one reference cell, in order to determine the programmed or non-programmed status of said memory cell of the memory matrix.

Another embodiment of the present invention is a memory including a first matrix of a plurality of memory cells and a second matrix of a plurality of virgin reference memory cells. First means coupled to the first matrix, for selecting a first memory cell from the plurality of memory cells and second means, coupled to the second matrix, for selecting a first virgin reference memory cell from the plurality of virgin reference memory cells are provided. The memory also includes a first load, a second load and a first branch to connect the first load to the first matrix with the first branch including a first transistor to enable current flow from the first load to the first matrix. A second branch connects the second load to the second matrix with the second branch including a second transistor to enable current flow from the second load to the second matrix. A first biasing circuit is coupled to the first transistor to control the first transistor and a second biasing circuit is coupled to the second transistor to control the second transistor. A third transistor is connected in parallel to the first transistor. A first equalization transistor, coupled between a first node on the first branch and a second node on the second branch, is controlled by a precharge signal to equalize the first and second nodes and a comparing means compares a first current from the first load to a second current from the second load whereby a difference therebetween indicates the selected memory cell is programmed.

Another embodiment of the present invention is an apparatus for determining a condition of a predetermined memory cell where the apparatus includes a first matrix of memory cells, including the predetermined memory cell, and a first multiplexor circuit coupled to the first memory matrix to select the predetermined memory cell. The apparatus also includes a first load and a first enabling transistor, having a size W, coupled to the first load at a first node and to the first memory matrix at a second node. A second matrix of at least one reference memory cell and a second multiplexor circuit coupled to the second memory matrix to select the at least one reference memory cell are included. Further, a second load is provided and a second enabling transistor, having a size W, is coupled to the second load at a third node and to the second memory matrix at a fourth node. A first equalization transistor is coupled between the second node and the fourth node and a first redistribution transistor is coupled between the first node and the fourth node and has a control terminal coupled to a control terminal of the first enabling transistor.

Another embodiment of the present invention is a method of determining a programmed/non-programmed condition of a predetermined memory cell in a first matrix of memory cells, the method including steps of coupling a first current source to the first matrix through a first enabling transistor, the first enabling transistor coupled to the first current source at a first node and to the first matrix at a second node. Further, a second current source is coupled to a second memory matrix through a second enabling transistor, the second enabling transistor coupled to the second current source at a third node and to the second matrix at a fourth node wherein the second matrix includes a virgin reference memory cell. Next, a first equalization transistor is coupled between the second node and the fourth node, and a first redistribution transistor is coupled between the first node and the fourth node and the predetermined memory cell is coupled to the second node. A reference memory cell is coupled to the fourth node and first and second enabling transistors is coupled and the first redistribution transistor are activated. The first equalization transistor is activated to equalize the second node and the fourth node and when the second and fourth nodes have become equalized, the first equalization transistor is deactivated. A first voltage at the first node is compared with a second voltage at the third node and the predetermined memory cell is determined to be non-programmed when the first voltage is substantially equal to the second voltage.

BRIEF DESCRIPTION OF THE DRAWINGS

Further characteristics and advantages of the invention will become apparent from the description of a preferred, non-limiting embodiment of the reference system according to the present invention, illustrated by way of non-limiting examples in the accompanying drawings, wherein.

DETAILED DESCRIPTION

Figure 4:
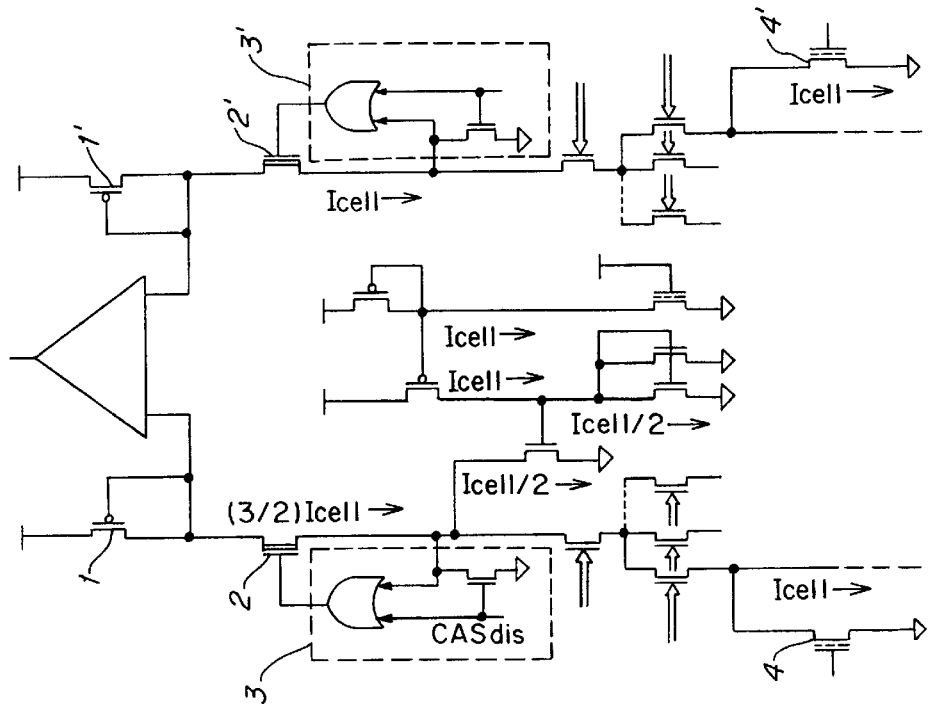
FIG. 4 is a circuit diagram of a second conventional reference system.
Figure 2:
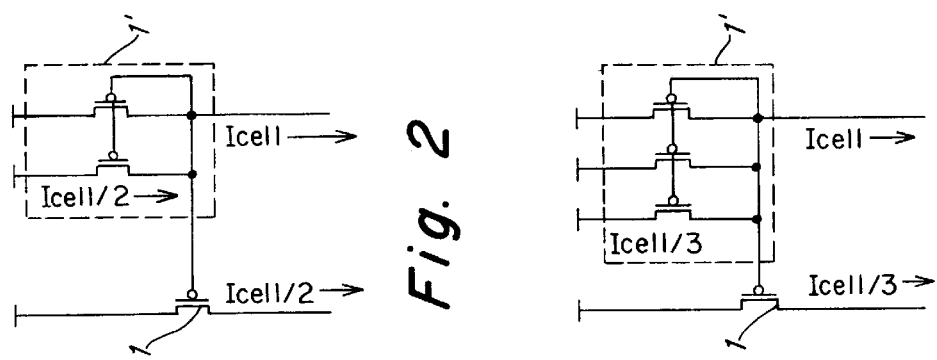
FIG. 2 is a circuit diagram of a portion of the first conventional reference system, shown in FIG. 1.

With reference to the above figures, and in particular to FIGS. 5 and 6, a first embodiment and a second embodiment, respectively, of the reference system according to the present invention will be described. In the various figures, identical elements are designated by identical reference numerals.

Figure 5:
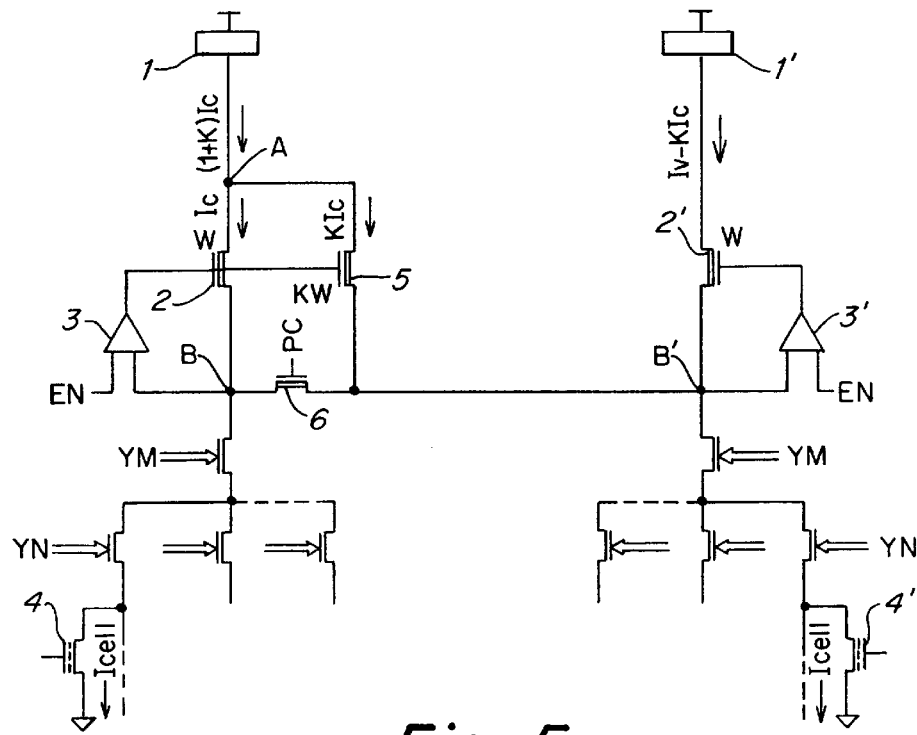
FIG. 5 is a circuit diagram of a first embodiment of the reference system according to the present invention.

With reference to FIG. 5, a first embodiment of the reference system, according to the present invention, includes two circuit branches, a matrix branch and a reference branch, to which respective loads 1 and 1' are connected. The loads can advantageously be, for example, current sources.

The matrix branch includes a first transistor 2 for enabling a connection between the load 1 and a memory matrix, a generic biasing structure 3, circuit for selecting a memory cell 4 of the memory matrix, advantageously provided by a first decoding bus YM and a second decoding bus YN, each having, for example, sixteen lines, for decoding a read address of a memory cell, and a plurality of memory cells 4 organized into the matrix. In the various figures, a single memory cell 4, provided by a floating gate transistor, is shown for the sake of simplicity.

The size of the transistor 2 is generally referenced by W.

Likewise, the reference branch includes, in addition to the load 1', a first transistor 2' for enabling a connection between the load 1' and a reference memory matrix, a generic biasing structure 3', a circuit for selecting at least one virgin reference cell, advantageously provided by the first decoding bus YM and the second decoding bus YN, each having, for example, sixteen lines, for decoding a read address of a reference memory cell, and at least one virgin reference memory cell 4'.

Each matrix memory cell is compared with a reference memory cell. When the two memory cells being compared are in the same half-matrix, then both are stimulated by a same word line and the reference memory cells are on a reference bit line.

If instead the memory cells being compared are in two different half-matrices, then the reference cell is stimulated by appropriate reference word lines. In this case, the reference memory cells are aligned along a reference word line.

It is also possible to use a single virgin reference memory cell to perform the comparison for determining the status of a memory cell of the memory matrix.

A single reference memory cell 4', provided by a floating gate transistor, is shown in the various figures for the sake of simplicity.

The size of the transistor 2' is also generally referenced by W.

The matrix branch also includes a second transistor 5 for redistributing the current of the load 1. The second transistor 5 is interposed between a node A of said branch and an equalization transistor 6 that is interposed between the matrix branch and the reference branch.

A gate terminal of the transistor 5 is biased, as is a gate terminal of the transistor 2, by the biasing structure 3.

A precharge signal PC is sent to a gate terminal of the equalization transistor 6. When the precharge signal PC is high, nodes B and B' of the matrix branch and of the reference branch, respectively, are equalized.

The second transistor 5 is of a same type as the transistor 2, and its size is referenced by KW, where K is a parameter that can vary according to the mirroring ratio that one wishes to obtain. For example, if one wishes a 2:1 mirroring ratio, it is necessary to assume K=0.5. In this case, the size of the transistor 5 is half the size of the transistor 2.

Figure 6:
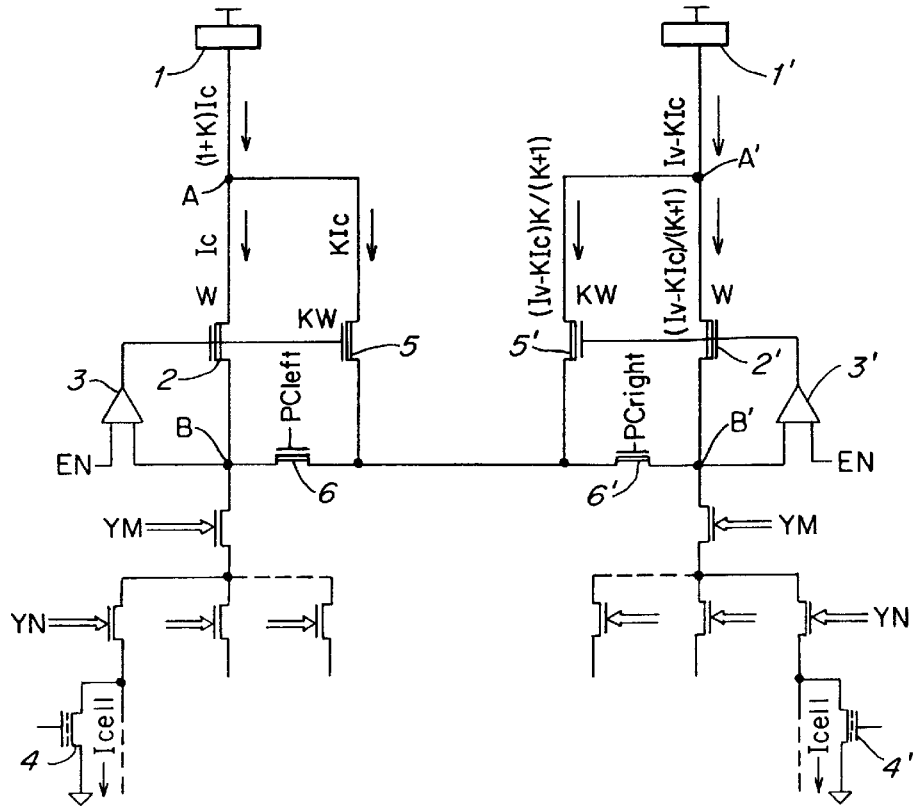
FIG. 6 is a circuit diagram of a second embodiment of the reference system according to the present invention, wherein a double interchangeable reference system is implemented.

FIG. 6 illustrates a second embodiment of the reference system according to the present invention. A difference with respect to the first embodiment, as shown in FIG. 5, is the presence of a second transistor 5' for redistributing the current of the load 1' for the reference branch. This transistor 5' is identical to the transistor 5 of the matrix branch in terms of size and in terms of connection method. Therefore, the biasing structure 3' also biases a gate terminal of the transistor 5'.

Furthermore, in the reference branch there is a second equalization transistor 6', whose gate terminal receives the precharge signal PC. The transistor 6' is connected exactly like the transistor 6 and is thus connected between the nodes B and B' of the matrix branch and the reference branch, respectively.

In this manner, as shown in FIG. 6, the matrix branch and the reference branch are symmetrical and easily interchangeable.

Figure 9:
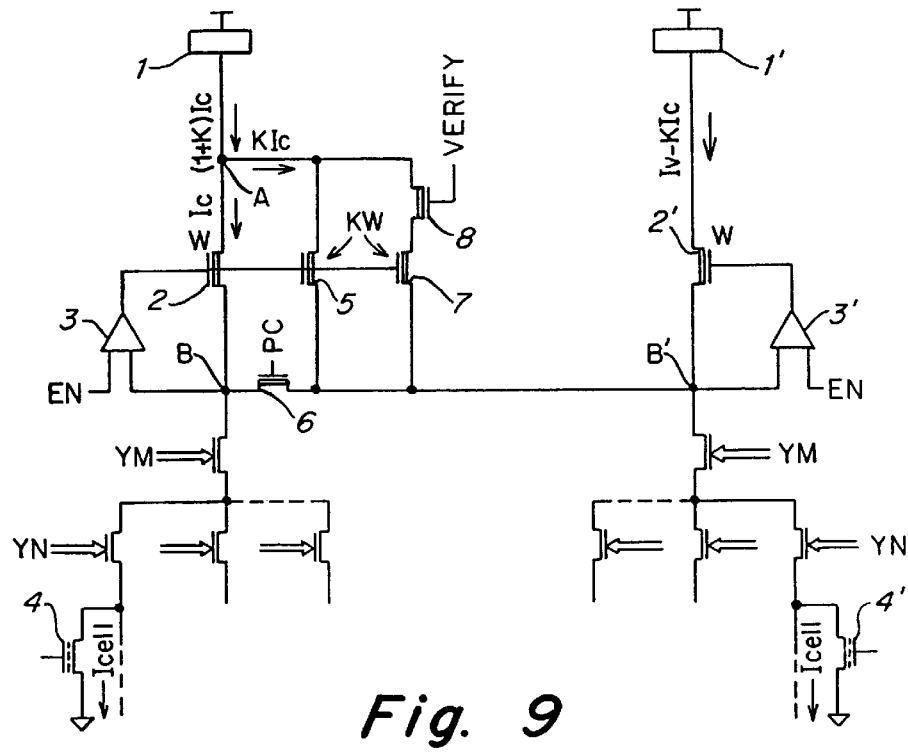
FIG. 9 is a circuit diagram of a third embodiment of the reference system according to the present invention.

FIG. 9 is a view of a third embodiment of the reference system according to the present invention.

This third embodiment differs from the first embodiment in that it comprises an additional transistor 7, whose size, together with the transistor 5, totals KW. The transistor 7 is connected in parallel to the branch that includes the transistor 5.

The transistor 7 is therefore interposed between the node A and the connection between the matrix and reference branches. A gate terminal of the transistor 7 is also biased by the biasing structure 3.

Another enabling transistor 8 is connected between the node A and the transistor 7. The enabling transistor 8 receives, at its gate terminal, an enabling signal VERIFY that is adapted to enable a current path from the node A to the memory cell 4 after also passing through the transistor 7.

This enabling signal VERIFY, by activating the transistor 8, enables the provision of a 3:1 mirroring ratio.

Figure 10:
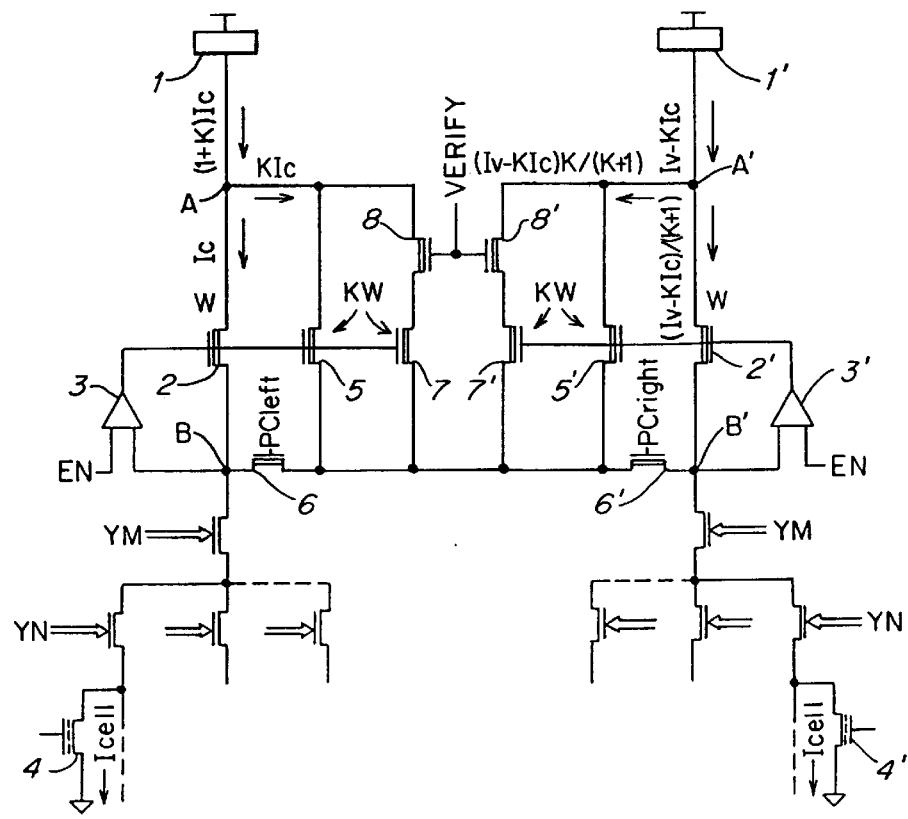
FIG. 10 is a circuit diagram of a fourth embodiment of the reference system according to the present invention.

FIG. 10 is a view of a fourth embodiment of the reference system according to the present invention.

This fourth embodiment differs from the second embodiment in that it comprises additional transistors 7' and 8' that are similar to the transistors 7 and 8 described for the third embodiment shown in FIG. 9. Therefore, FIG. 10 illustrates a double interchangeable reference system, whose reference branch is identical to the matrix branch, already described in FIG. 9.

In this case, therefore, there is another equalization transistor 6', which is similar to the transistor 6 and is driven by a precharge signal PCright (whereas the transistor 6 is driven by a precharge signal PCleft). Depending on the switching-on of the transistor 6 or 6' as a consequence of the high signals PCleft and PCright, the reference branch is swapped with the matrix branch, and vice versa.

In particular, if one wishes to swap the reference branch with the matrix branch, it is necessary to switch off the transistor 6' (with a low PCright); the current will flow in the matrix branch, which now becomes the reference branch.

In the various figures, the transistors that are present in the circuit are of the N-channel type. In particular, the transistors 2-2', 5-5', 6-6', 7-7', and 8-8' are native transistors with a low threshold.

Figure 12:
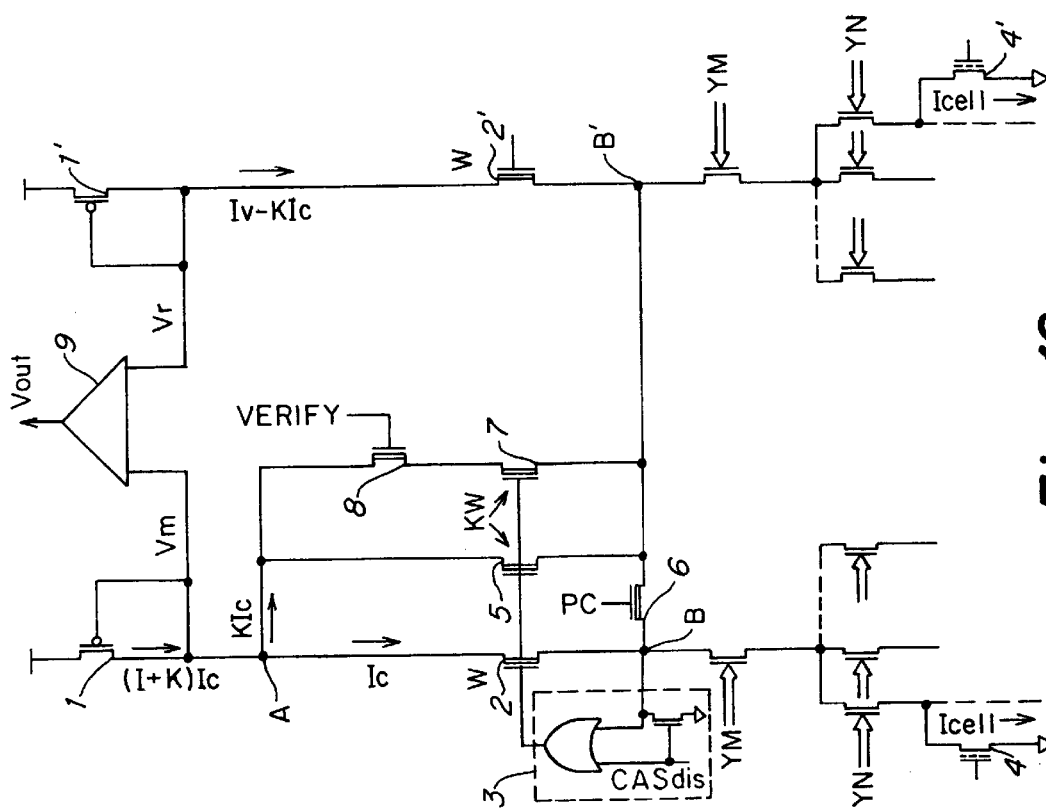
FIG. 12 is a circuit diagram that illustrates in detail a differential amplifier that is applied to the third embodiment of the reference system according to the present invention shown in FIG. 9.

With reference to FIG. 12, a reference system according to the present invention, similar to the one shown in FIG. 9, includes a differential amplifier 9. The amplifier 9 is adapted to emit an output signal Vout that is a difference of voltage values Vm and Vr that are present on the matrix branch and on the reference branch, respectively.

Figure 13:
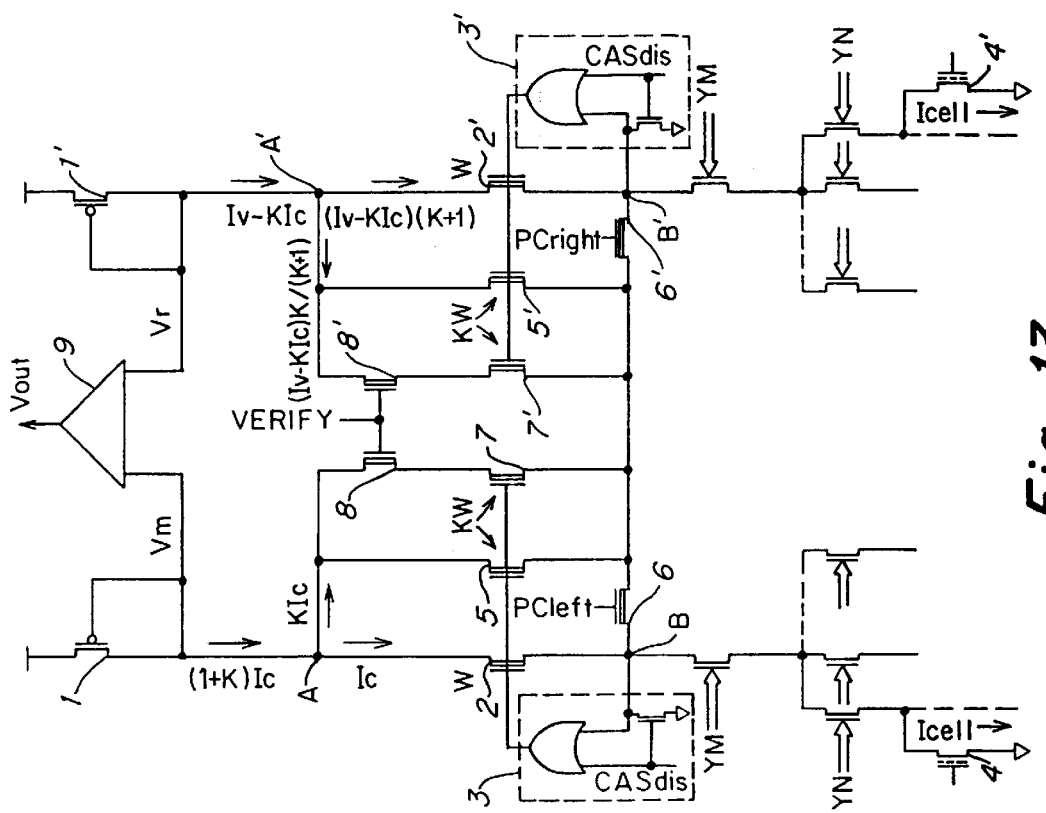
FIG. 13 is a circuit diagram that illustrates in detail a differential amplifier applied to the fourth embodiment of the reference system according to the present invention shown in FIG. 10.

Similarly, FIG. 13 shows a reference system according to the present invention, such as the one shown in FIG. 10, which illustrates the same differential amplifier 9 of FIG. 12, which has the same function that has already been described.

Figure 24:
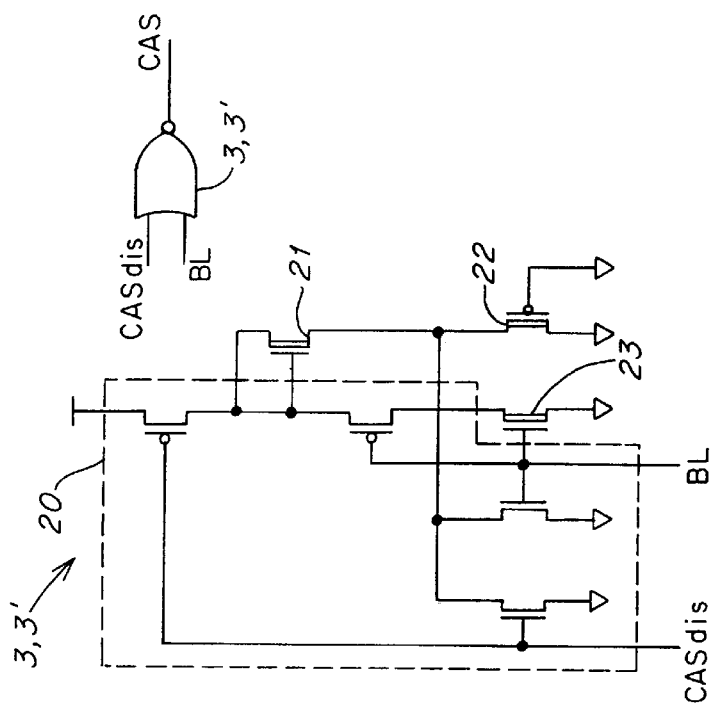
FIG. 24 is a circuit diagram of an embodiment of a biasing structure that can be used in the reference system according to the present invention.

In FIGS. 12 and 13, the generic biasing structures 3 and 3' are shown explicitly in one possible circuital configuration, i.e., provided by a cascode circuit which can assume a more complex form that is shown explicitly in its circuital embodiment in FIG. 24.

Figure 14:
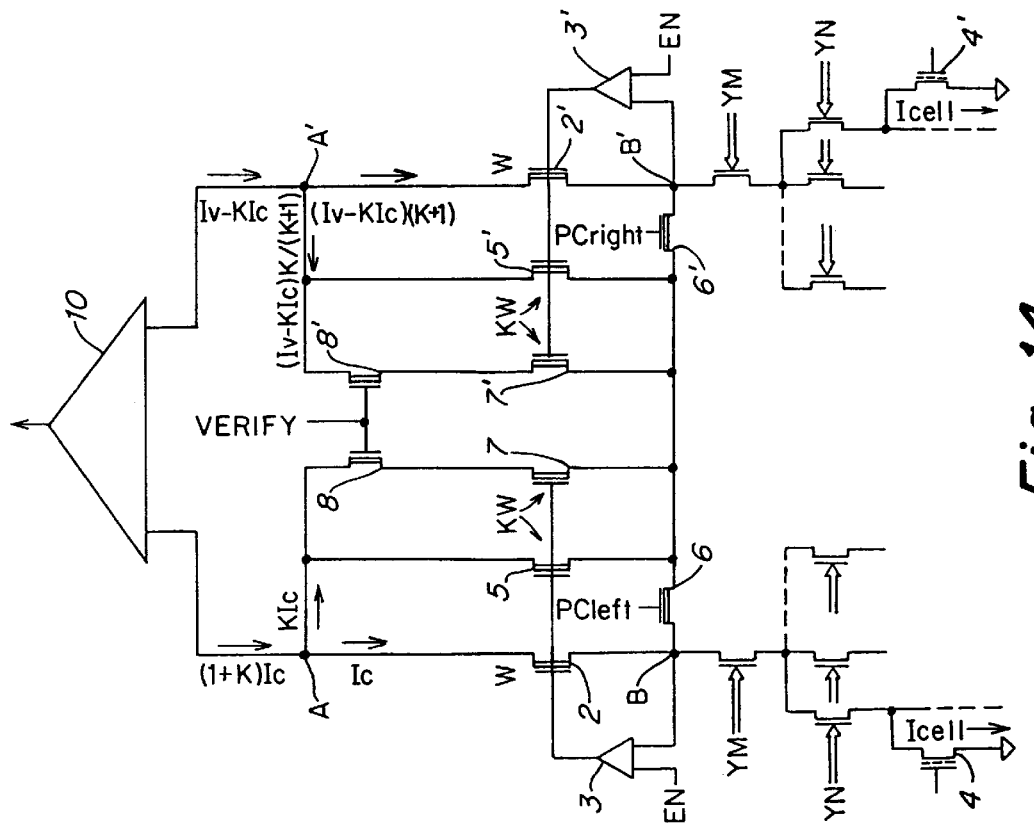
FIG. 14 is a circuit diagram of the fourth embodiment of the reference system according to the present invention, illustrated in FIG. 10, in which a difference in currents between the reference and matrix branches is produced.

FIG. 14 illustrates a fourth embodiment of FIG. 10, to which a differential current amplifier 10 is applied which is adapted to emit an output voltage that is proportional to the difference between currents that are present on the matrix branch and on the reference branch.

Figure 15:
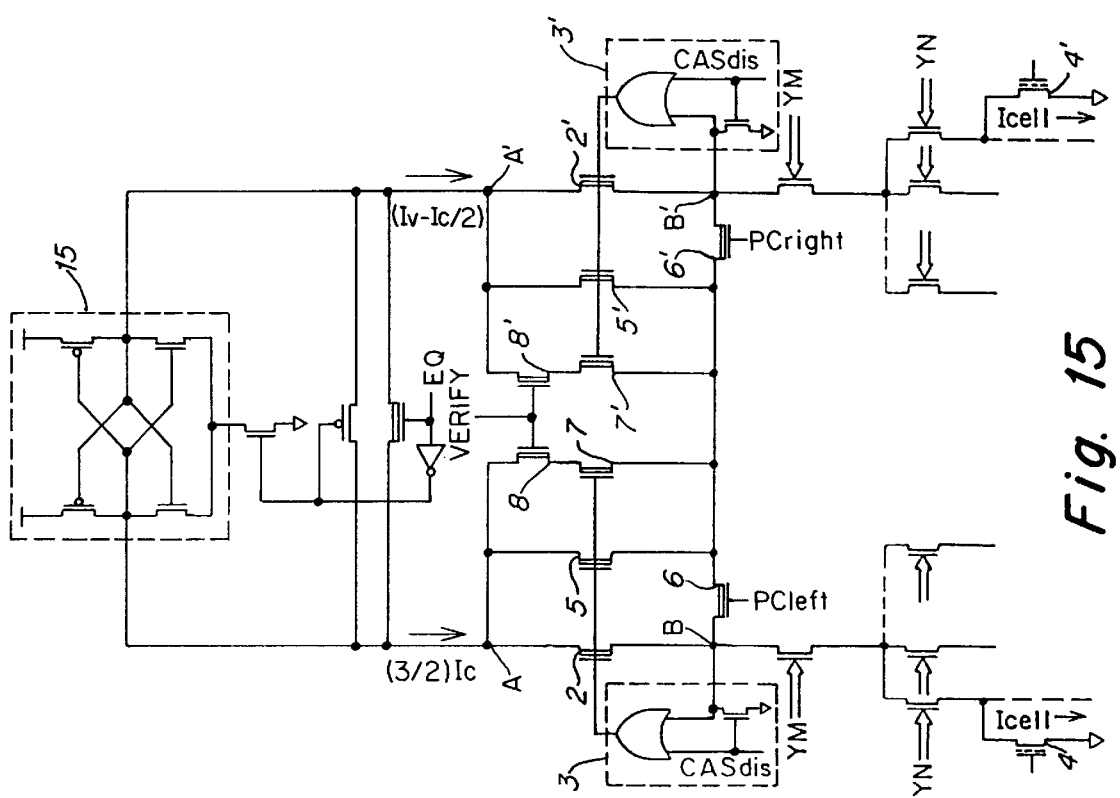
FIG. 15 is a circuit diagram of one embodiment of a circuit that is adapted to produce a current difference as shown schematically in FIG. 14.

FIG. 15 is a view of the reference system according to the present invention, which illustrates an embodiment of a the present invention using a latch-type differential current amplifier 15 in place of the differential current amplifier 10 that is shown schematically in FIG. 14.

Figure 16:
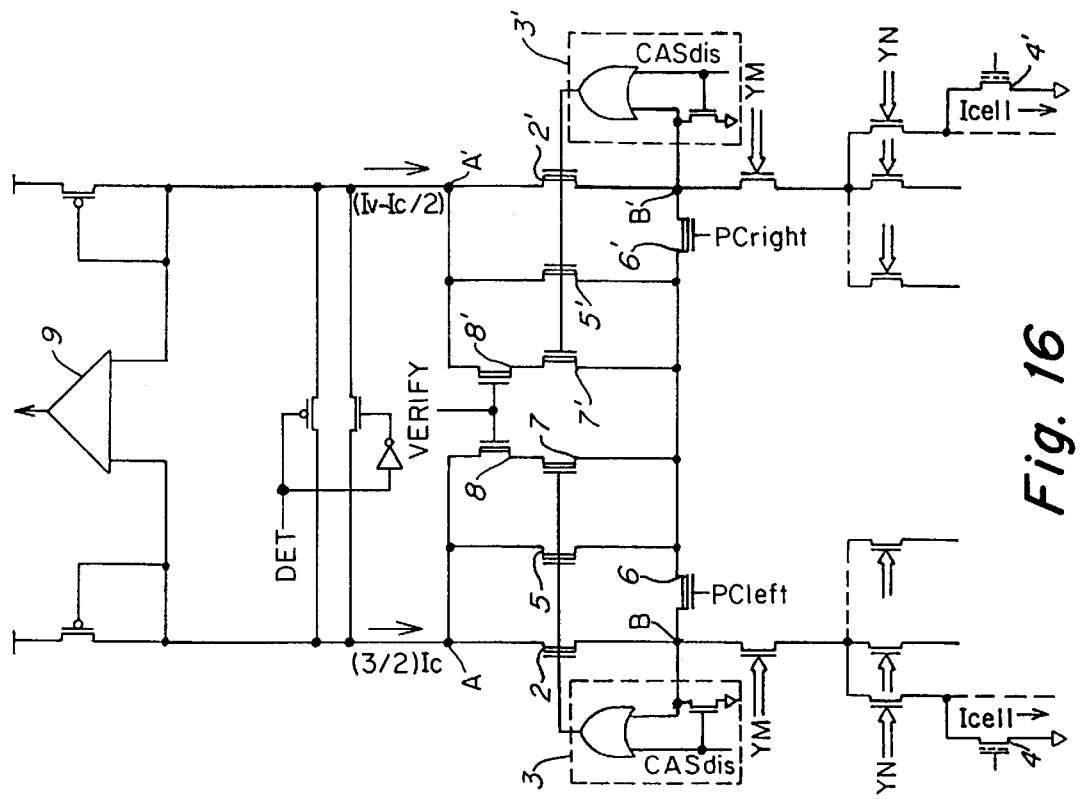
FIG. 16 is a circuit diagram of an embodiment of a circuit that is adapted to produce a voltage difference as shown schematically in FIG. 13.

FIG. 16 is a view of an embodiment of the present invention using a differential voltage amplifier 9, in place of the one shown in FIG. 13.

The charts of FIGS. 17 and 23 will be explained during the description to follow of the operation of the reference device according to the present invention.

FIG. 24 shows in detail a biasing structure 3, 3' of a dynamic cascode type, which has an advantage of providing a much faster precharging step than one provided by a constant-type bias signal BIAS.

The cascode structure 3, 3' is described in detail in European patent application no. 95830357 in the name of the same Applicant and is herein incorporated by reference in its entirety.

FIG. 24 shows, with the reference numeral 3, the cascode structure that can be used in the reference system according to the present invention, wherein the reference numeral 20 designates a conventional NOR gate structure.

The cascode structure 3 (or 3') is thus provided by adding appropriate native transistors 21, 22, and 23. The transistor 21 is of the N type, the transistor 22 is of the P type, and the transistor 23 is of the N type.

With reference to the above figures, and particularly to the fourth embodiment shown in FIG. 10, the operation of the reference system according to the present invention is as follows.

During a precharging step, the lines PC (PCleft, PCright) are kept at a high logic level, allowing a balanced precharging of the two branches. In this manner, the transistors 6 and 6' are turned on and provide equalization of the nodes A and A'.

The precharging step ends with a drop to a logic level "0" of the precharging signal PCleft of the precharging line connected to the matrix line.

This event modifies the current paths, altering the initial symmetry of the currents in the two branches, set by the equalization provided by the transistors 6 and 6'. As a result the currents redistribute, complying with various relations that will be described hereinafter.

The matrix branch is required to provide part of the current of the reference memory cell, reducing by the same amount the current that is drawn from the load 1' of the reference branch.

The symbols adopted to reference the various currents that are present in the reference system according to the present invention are now described.

Im: matrix current, provided by a sum of the currents that flow in the matrix branch;

Ic: cell current, which indicates a current that flows in the memory cell 4;

Iv: current of a virgin cell, i.e., a maximum current that can flow in a generic cell that has not yet been programmed, when a full stimulus signal is applied to its gate terminal; and Ir: current that flows in a reference memory cell connected to the reference branch.

Assume, for the sake of simplicity, that only the transistors 5 and 5' are activated, without the further activation of the configuration VERIFY, and assume KW as the size of said transistors 5 and 5'. Therefore, the matrix current Im, i.e., the current that must be delivered by the load 1, a sum of the currents that branch off from the node A to flow in the transistors 2, 5, and optionally 7 if the signal VERIFY is high.

In this case, the relation that the matrix current must comply with is the following:

$$Im=Ic(1+K) \quad (1)$$

where Ic is the current that flows in the transistor 2 and KIc is the current that flows in the redistribution transistor or transistors 5 and 7.

In the same manner, the current in the reference branch is:

$$Ir=Iv-Kic \quad (2)$$

In the case of FIG. 10, the reference branch has two paths, each of which is affected by the following current flows:

a current equal to $(Iv-KIc)K/(K+1)$ in the path that leads to the transistors 5' and 7' and a current equal to $(Iv-KIc)/(K+1)$ in the path that leads to the transistor 2'.

The above relations (1) and (2) apply when there is a so-called linearity condition, in which Ic<Iv/K holds true.

In other words, the maximum condition is Ic=Iv. The mirroring current in fact cannot exceed the current Iv required by the reference memory cell.

When the relation Ic>Iv/K holds true instead, i.e., when a so-called saturation condition occurs (the saturation condition can be viewed as the condition in which full delivery of the current is performed by the matrix branch), the following relations hold:

$$Im=Ic+Iv \text{ and } Ir=0$$

From these relations it is possible to deduce the following conditions:

(a) when the memory cell 4 is programmed, then the matrix current Im and therefore the current Ic are zero, i.e., Im, Ic=0. Then one also has Ir=Iv.

When, instead, the memory cell 4 is not programmed, the following relation holds:

$$Im=(1+k)Iv$$

then Ir=(1−K)Iv also holds.

(b) there is a case in which the memory cell 4 is in a balanced or equilibrium condition, in which the currents of the matrix branch and of the reference branch become equal.

In this case one has:

$$Im=Iv/(1+2K)$$

$$Ir=Iv/(1+2K)$$

$$Im=Ir \rightarrow Ic(1+K)=Iv-KIc \rightarrow Ic=Iv(1+K)/(1+2K)$$

(c) since the saturation condition entails that:

$$Ir=0$$

$$Kic=Iv \text{ and therefore } Ic=Iv/K$$

(d) then, on the basis of the above relations, the value of the current at the loads 1 and 1' at the saturation point is:

$$Im=(1+K)Ic \rightarrow Im=(1+1/K)Iv$$

$$Ir=Iv-KIc \rightarrow Ir=0$$

(e) the maximum current vector of the load 1 of the matrix branch is:

$$Ic=Iv$$

$$Kic=Iv$$

$$Im=Ic+KIc \rightarrow Im=2Iv$$

(f) the vector of the current difference at the loads 1 and 1' will be:

$$Im-Ir=(Ic+KIc)-(Iv-KIc)$$

$$Im-Ir=(1+2K)Ic-Iv$$

(g) finally, a derivative with respect to the cell current Ic of the current difference vector provides the following result:

$d[Im-Ir]/Ic \rightarrow d[(1+2K)dIc-Iv]/dIc \rightarrow d(Im-Ir)/dIc=(1+2K)$

The last relation leads to the observation that since $(1+2K)>1$, the variation of the current at the loads is greater than the variation of the current of the memory cell. Therefore, there is a cell current variation gain effect, introduced by the particular redistribution of the currents of the system.

This gain effect can be described and quantified as follows:

$$gain=(1+2K).$$

With reference to the above relations, the values of the equations at two particular values of the parameter K, namely K=0.5 and K=1, are now given explicitly.

If K=0.5, only the transistors 5 and 5' are active, whereas if K=1 (and VERIFY is high), both transistors 5-5' and 7-7' are active.

Therefore, if one considers, for the two values of K, the above described cases (a)–(g), one obtains the following table:

| K = 0.5 | K = 1 |
|---|---|
| (a) Ic = 0 Ir = Iv | Ic = 0 Ir = Iv |
| (b) Im = Ir = (¾)Iv | Im = Jr = (⅔)Iv |
| (c) unaffected by saturation | Ic = Iv |
| (d) unaffected by saturation | Im = 2Iv Ir = 0 |
| (e) Im = (3/2)Iv | Im = 2Iv |
| (f) –Iv (Ic = 0); Iv (Ic = Iv) | –Iv (Ic = 0); 2Iv (Ic = Iv) |
| (g) gain = 2 | gain = 3 |

It should be noted that in the balanced condition, the matrix current Im is equal to the current of the reference branch; i.e., the cell current Ic is equal to half of the value of the maximum current of a virgin memory cell (Iv), if one uses a 2:1 ratio, i.e., with K=0.5.

With reference to FIG. 6, for example, the balanced condition with K=0.5 given by Im=Iv/(1+2K) and Ir=Iv/(1+2K) therefore leads to Im=(¾)Iv and Ir=(¾)Iv.

Figure 7:
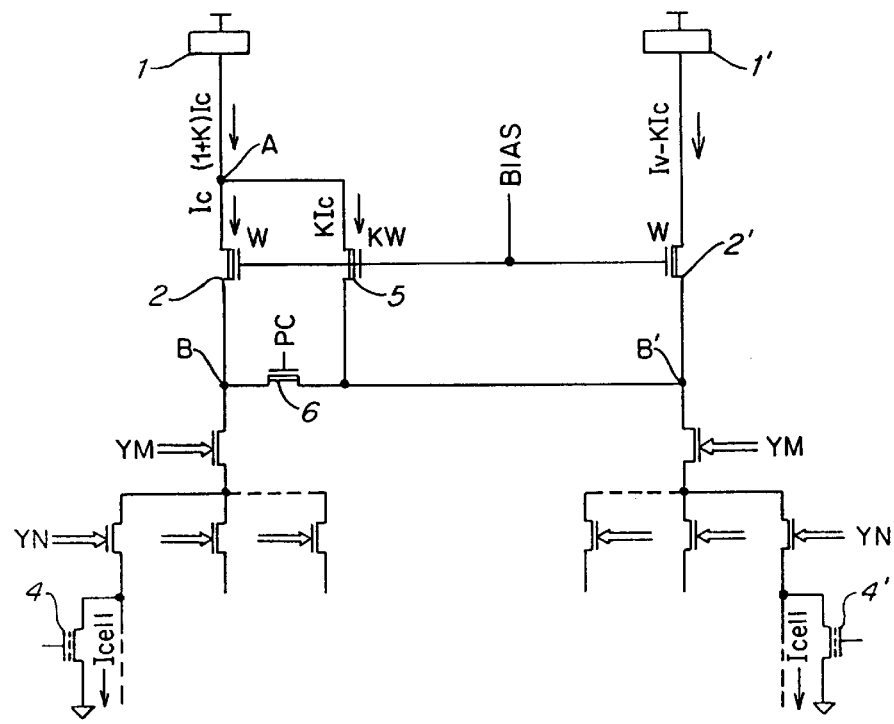
FIG. 7 is a circuit diagram of a variation of the first embodiment of the reference system according to the present invention illustrated in FIG. 5.

A comparison of the reference system according to the present invention, for example the one shown in FIG. 7 (2:1 imbalance), with a conventional reference system, can be performed by creating relations similar to those mentioned above. In this case, therefore, every unitary transistor is affected by a maximum matrix current vector given by Ium=½ Iv.

With reference to said unitary vector, one can write:

$$Ium=Ic \text{ (Ic equal to, or less than, (½)Iv)}$$

$$Iur=(½)Iv$$

where Iur is the unitary current vector of the reference.

The balanced condition is obtained from the following equality:

$$Ium=Iur$$

$$Ic=(½)Iv$$

Between the matrix branch and the reference branch there is a current difference given by:

$$|Ium-2Iur|$$

$$|Ic-2*(½)Iv|$$

The maximum current signal conditions are obtained when:

| (a) Ic = 0 | {Im = 0 |
| |Ic – 2*(½)Iv| | (programmed cell) |
| --->|0 – Iv| = Iv | {Ir = Iv |
| (b) Ic = (½)Iv | {Im = (½)Iv |
| |Ic – 2*(½)Iv| | (virgin cell) |
| |(½)Iv - Iv| = (½)Iv | {Ir = Iv |

The maximum current difference vector is Iv in the case of a programmed cell and is instead (½)Iv in the case of a cell with a conductivity greater than, or equal to, (½)Iv.

In this manner there is no "gain" effect as seen in the reference system according to the present invention, since a variation in the cell current equal to (½)Iv is matched by an equal variation of the current at the loads.

Figure 3:
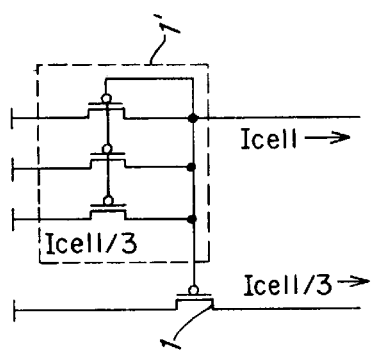
FIG. 3 is a circuit diagram of the portion of the first reference system shown in FIG. 2, modified according to a second conventional embodiment.
Figure 1:
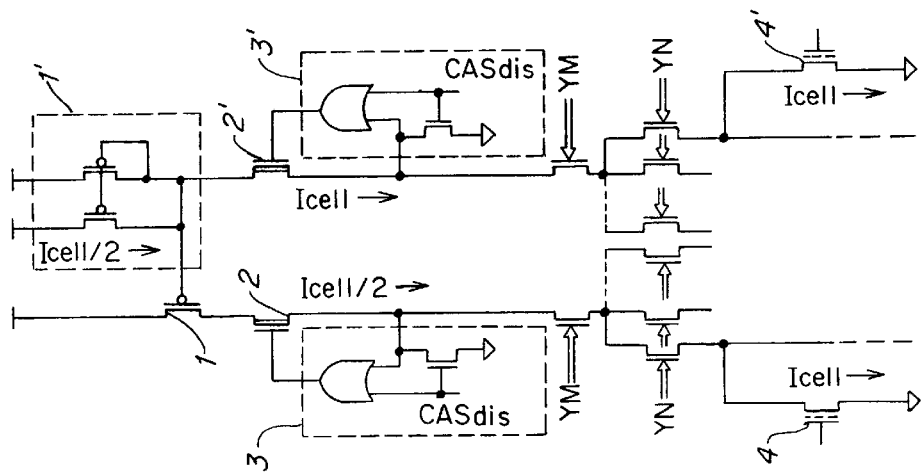
FIG. 1 is a circuit diagram of a first conventional reference system.

The case of a 3:1 ratio described in FIG. 3 (similar to the case of K=1 of the system according to the present invention) is now analyzed.

Each unitary transistor is affected by a current vector:

$$Ium=⅓Iv$$

By referring to said unitary vector, one can write:

$$Ium=Ic \text{ (Ic less than, or equal to, (⅓)Iv)}$$

$$Iur=(⅓)Iv$$

The balanced condition is obtained from the following equality:

$$Ium=Iur$$

from which $$Ic=(⅓)Iv$$

Between the two branches there is therefore a current difference:

$$|Im-Ir|$$

$$|Ic-3*(⅓)Iv|$$

The maximum signal conditions are obtained when:

| (a) Ic = 0 | ---> {Im = 0 |
| |Ic – 3*(⅓)Iv| | (programmed cell) |
| |0 – Iv| = Iv | --->{Ir = Iv |
| (b) Ic = (⅓)Iv | --->{Im = (⅓)Iv |
| |Ic – (⅓)Iv| | (virgin cell) |
| |(⅓)Iv – Iv| = (⅔)Iv | --->{Ir = Iv |

The current difference vector is asymmetrical and equal to Iv in the case of a programmed memory cell and is instead (⅔)Iv in memory cells with a conductivity that is greater than, or equal to, (⅓)Iv.

In this configuration, too, for the same reasons as in the preceding case, there is no current "gain" effect.

It is possible to plot charts to compare the characteristics of the two described reference systems so as to visually appreciate their differences. The explanatory charts are those of FIGS. 17–23.

Figure 17:
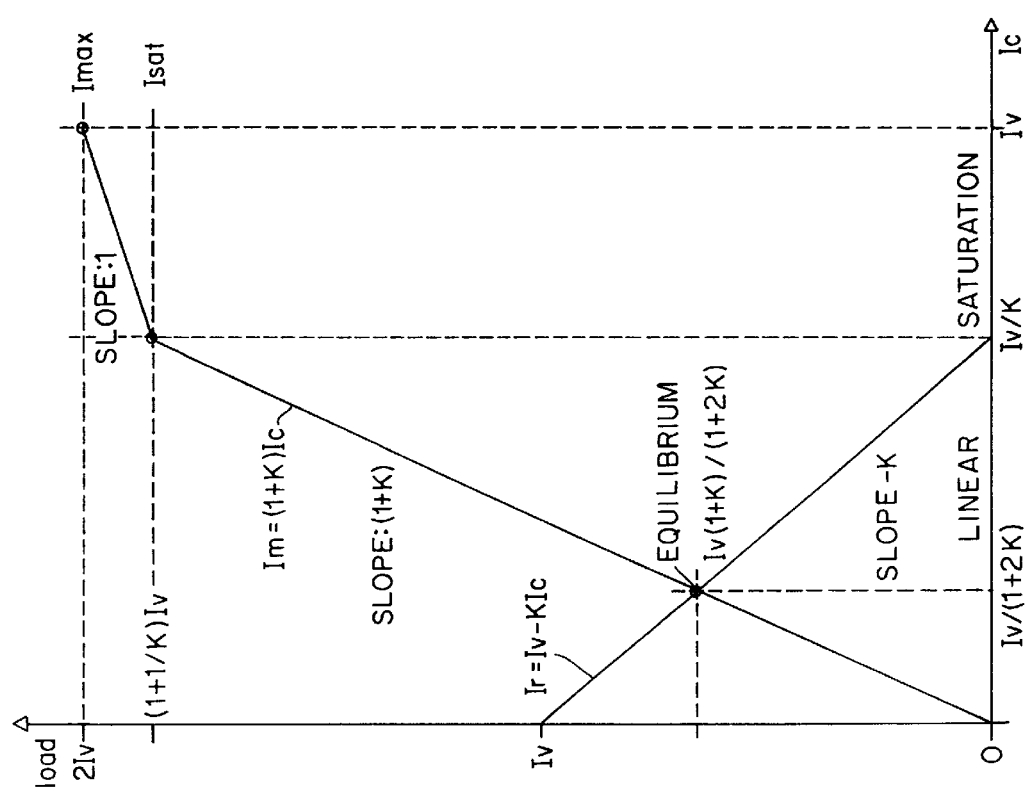
FIG. 17 is a chart of the current on the loads, as a function of the current that flows through the memory cell.

The chart of FIG. 17 plots the curves of the matrix current Im=(1+K)Ic and of the reference current Ir=Iv–KIc. The axes of the chart plot the current Ic on the abscissae and the current at the loads, Iload, on the ordinates.

The intersection point of the two curves is the equilibrium or balancing point.

Figure 18:
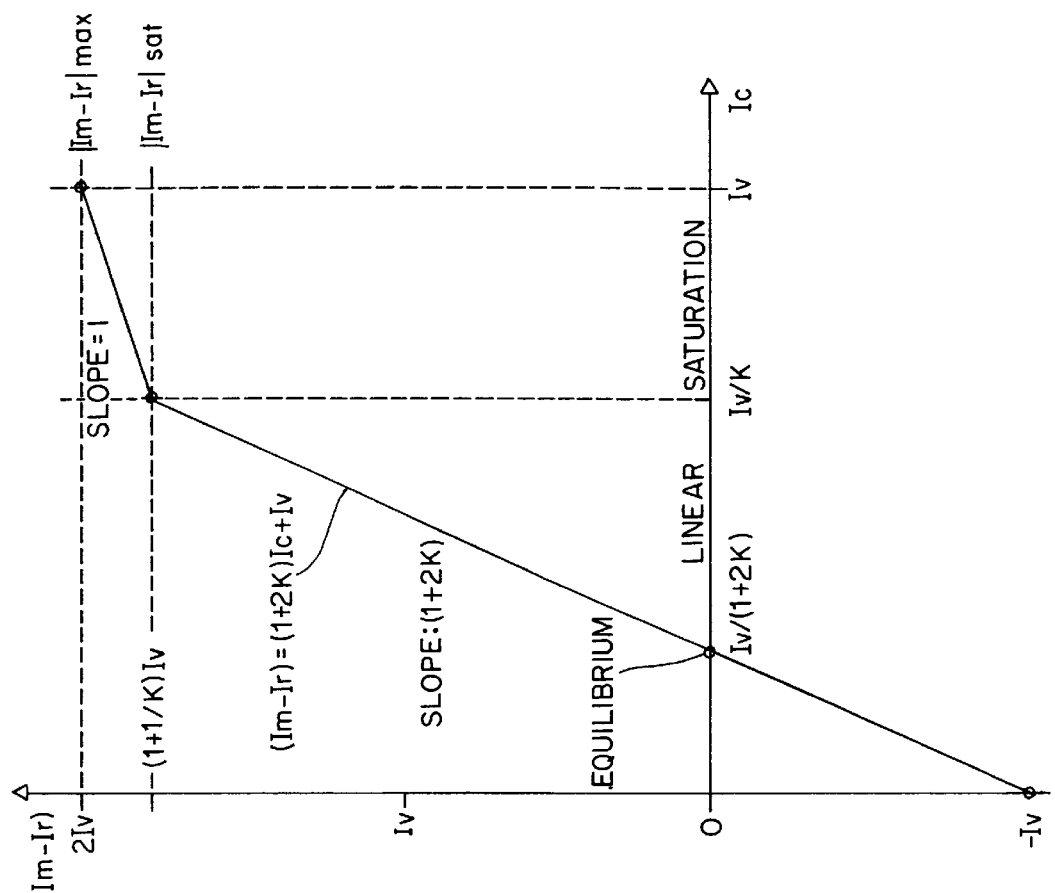
FIG. 18 is a chart of a difference between the memory matrix current and the current that flows in the reference branch, as a function of the current that flows in the cell.

The chart of FIG. 18 plots the curve of the current difference vector (Im–Ir) as a function of the cell current Ic.

In this case, the equilibrium point occurs when the cell current cancels out the difference (Im−Ir).

Figure 19:
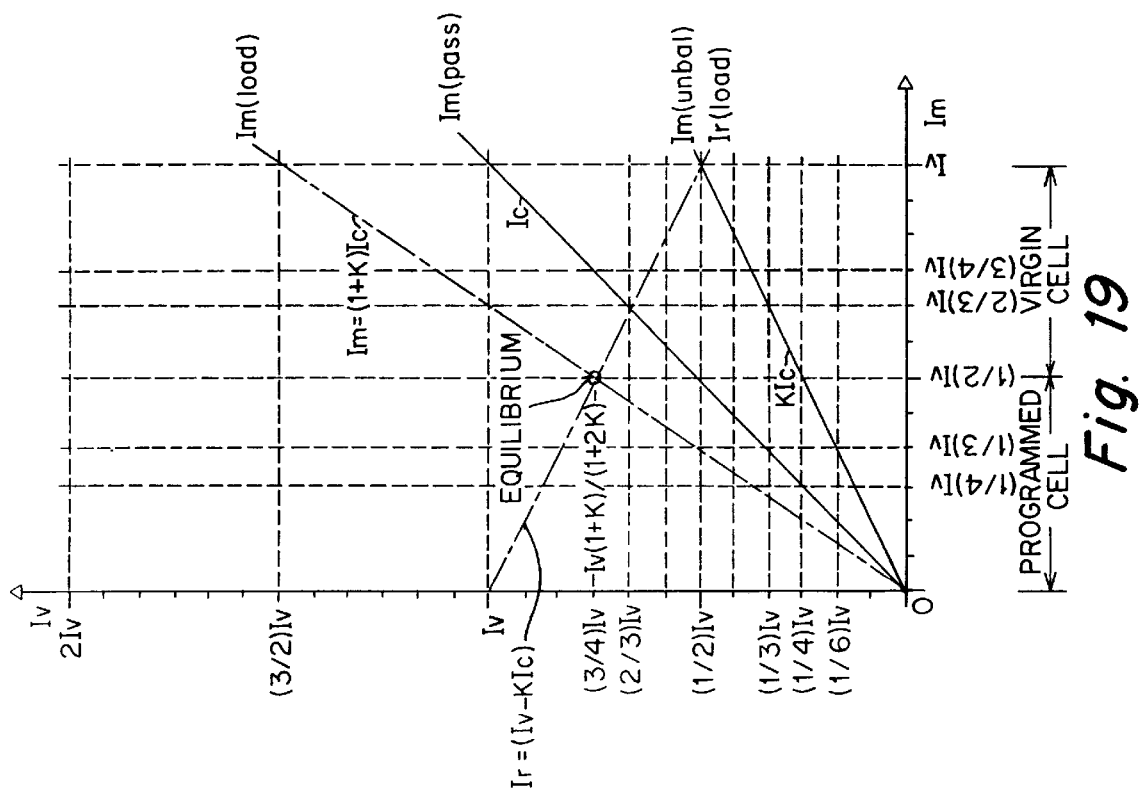
FIG. 19 is a chart that plots the currents that can be extracted from the circuit diagram of the first embodiment of the reference system according to the present invention illustrated in FIG. 5.

The chart of FIG. 19 plots the curves of the various currents in the reference system according to the present invention, illustrated for example in FIG. 5 for the sake of simplicity.

The curve indicated by Im=(1+KIc) is a sum of the two curves referenced by Im(Ir)=Ic, i.e., the current that flows through the transistor 2, and Im(unbal)=KIc, i.e., the current that flows through the transistor 5. It is assumed that K=0.5 in FIG. 19.

The equilibrium point is given by the intersection of the curve Ir and of the curve Im.

For values to the left of the equilibrium point, one has a programmed memory cell 4, whereas for values to the right one has a virgin memory cell 4.

Figure 20:
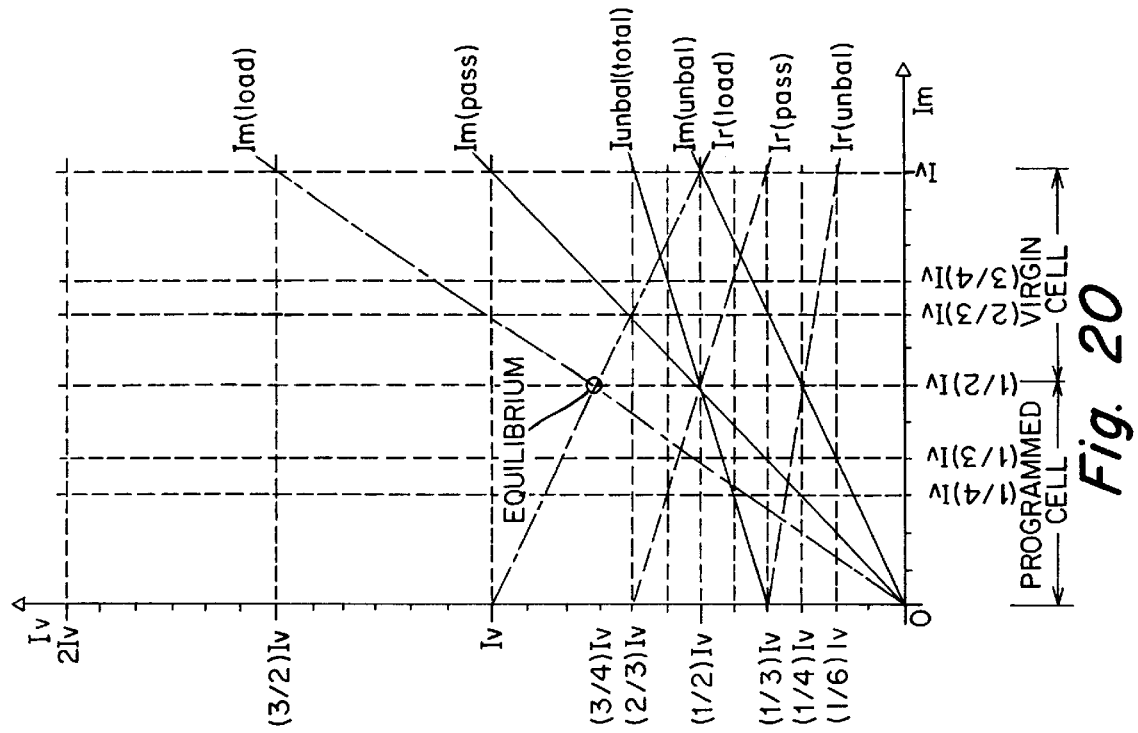
FIG. 20 is a chart that plots the currents that can be extracted from the circuit diagram of the second embodiment of the reference system according to the present invention shown in FIG. 6.

FIG. 20 is a chart that is similar to the one shown in FIG. 19 but applies only to the double symmetrical reference system according to the present invention, i.e., the embodiment illustrated in FIG. 10, when K=0.5.

In this chart, Im(load) designates the matrix current, Im(pass) designates the current that flows in the transistor 2, Im(unbal) indicates the current that flows through the transistor 5, Ir(load) designates the current that flows through the reference branch, Ir(unbal) references the current that flows through the transistor 5', and Ir(pass) indicates the current that passes through the transistor 2'.

Figure 21:
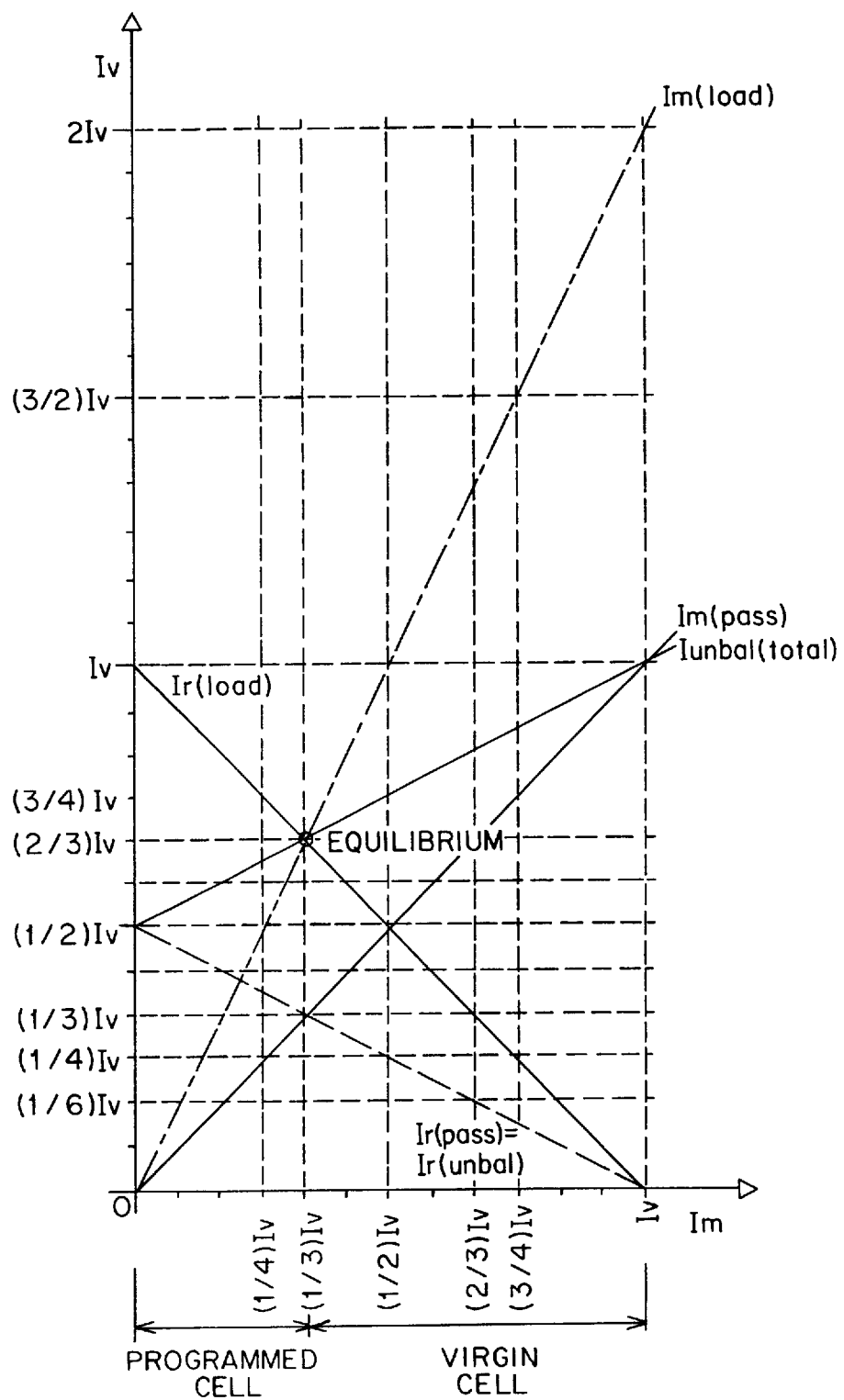
FIG. 21 is a chart that plots the currents that can be extracted from the circuit diagram of the fourth embodiment of the reference system according to the present invention shown in FIG. 10.

The chart of FIG. 21 plots the reference system according to the present invention, shown in FIG. 10, when K=1.

The curves plotted here have the same meaning as those described above, with the addition of the curve Iunbal(total), which represents a total current that flows through the two transistors 5 and 7.

Figure 22:
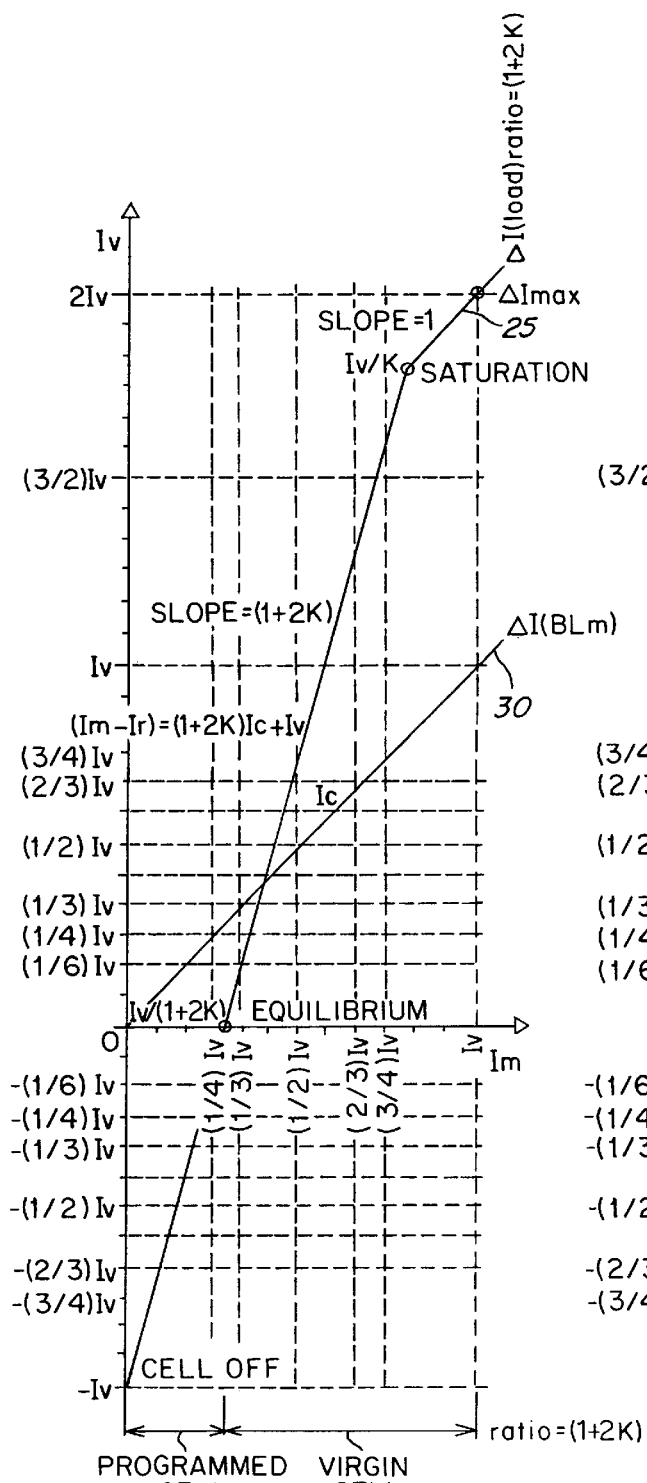
FIG. 22 is a general chart that plots the variation of the current on the loads with respect to the current that flows through the memory cell, for the reference system according to the present invention.
Figure 23:
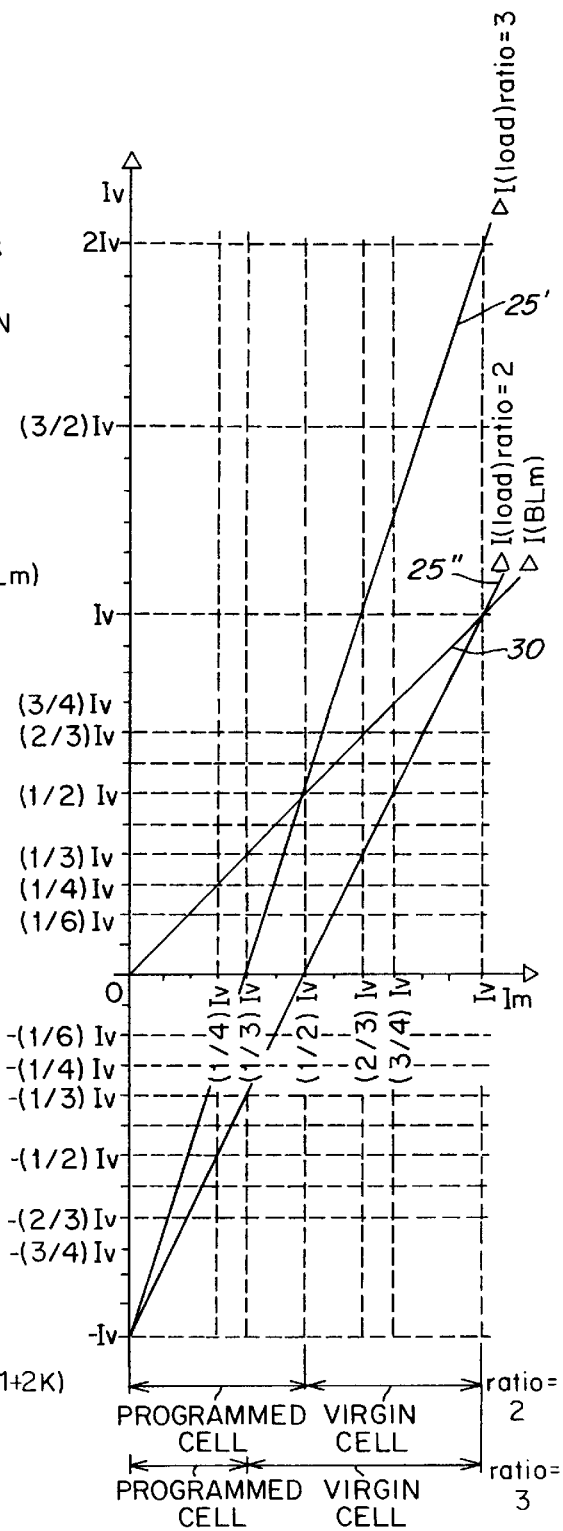
FIG. 23 is a chart that plots the variation of the current on the loads with respect to the current that flows in the memory cell, for the reference system according to the present invention, illustrating in particular two curves related to two different values of the parameter K.
Figure 25:
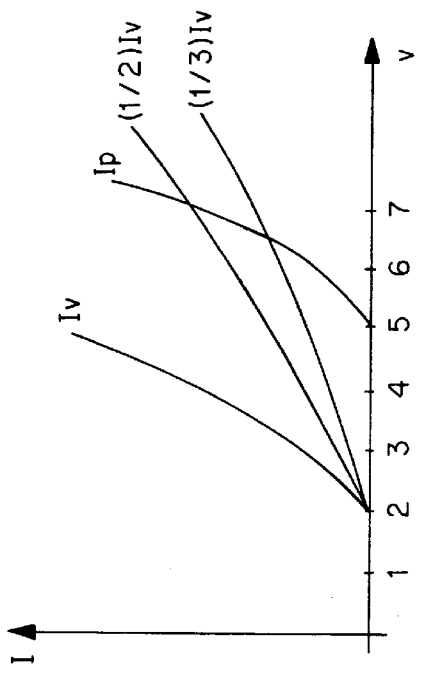
FIG. 25 is a chart of the conductivity curves of a cell, obtained with a first conventional reference system.
Figure 26:
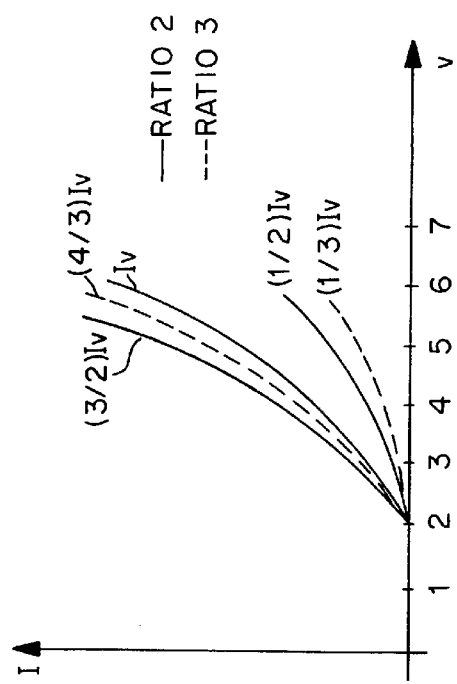
FIG. 26 is a chart of the conductivity curves of a cell, obtained with a second conventional reference system.

Finally, the charts of FIGS. 22 and 23 plot, with the general formula and when K=0.5, 1, respectively, a variation of the current at the loads with respect to the variation of the cell current. A first curve 25 plots the current variation at the loads, whereas a second curve 30 plots the current variation at the cell.

In the chart of FIG. 23, a third curve 25' plots the current variation at the loads for K=1 (ratio 3), whereas a fourth curve 25" plots the current variation at the loads for K=0.5 (ratio 2).

In practice, it has been observed that the reference system according to the present invention fully achieves the intended aim, since it allows one to sense, with much greater certainty than conventional systems, a conductivity value of a memory cell, thus allowing one to determine its status (programmed or virgin).

This is achieved by virtue of a current imbalance at the loads of the matrix branch and of the reference branch, achieved by virtue of a redistribution of the currents in the region of the transistors that are present on the matrix branch and the reference branch driven by the biasing structures.

It should be noted that in the reference system according to the present invention, no additional currents have been introduced to provide discrimination of the status of a memory cell, but only currents that are normally present have been used.

The current imbalance is provided with a 2:1 or 3:1 ratio, depending on whether only the transistor 5 (5') is active or the transistor 7 (7') is also active.

Other ratios are of course also possible, according to the number of transistors 5 and 7 that are added in parallel to the transistor 2. The overall size of these transistors must always be K times that of the transistor 2. In this manner, if there are three transistors in parallel to the transistor 2, the size of each transistor is equal to one third of the size of the transistor 2 and the current KIc that is distributed in the three branches formed by the three transistors in parallel to the branch that contains the transistor 2 is distributed in these three branches.

The reference system thus provided by the present invention is symmetrical and circuitally balanced, there are no current mirrors provided far from the memory cell, with consequent propagation problems, and current consumption is reduced.

The current imbalance at the loads occurs with a gain of the current at the loads in response to a variation in the current of the memory cell. This makes the reference system according to the present invention particularly adapted to current differentials, although it can be used with voltage differentials as well.

The symmetry of the matrix and reference branches, as provided in the second embodiment of the present invention, allows one to exchange the reference branch with the matrix branch without any circuital complication. In this manner, it is possible to sense the status of a memory cell in a memory half-matrix by taking as a reference a cell that belongs to the domain of the other half-matrix, and vice versa.

Finally, the current difference vector provided by the difference between the matrix current and the reference current is twice that of the above described conventional solutions, when only the transistor 5 (and/or 5') is activated.

The reference system thus conceived is susceptible to numerous modifications and variations, all of which are within the scope of the inventive concept.

Figure 8:
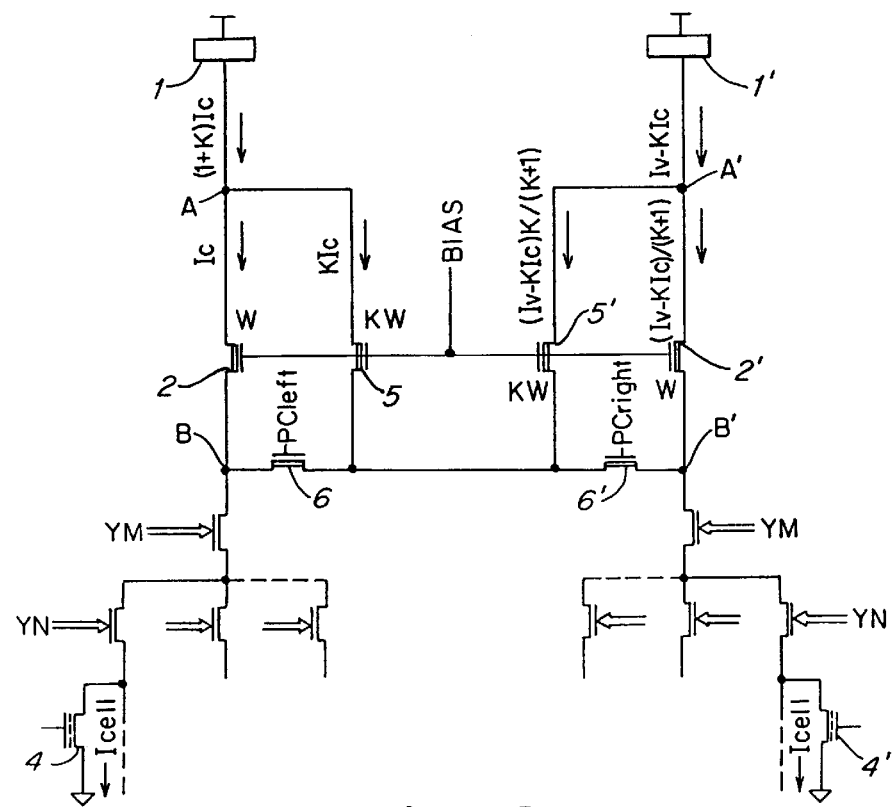
FIG. 8 is a circuit diagram of a variation of the second embodiment of the reference system according to the present invention illustrated in FIG. 6.

Thus, for example, the biasing structures 3 and 3' shown in the various figures can be replaced with a fixed bias value, designated by BIAS in FIGS. 7 and 8, which respectively show the first embodiment and the second embodiment of the reference system according to the present invention.

Figure 11:
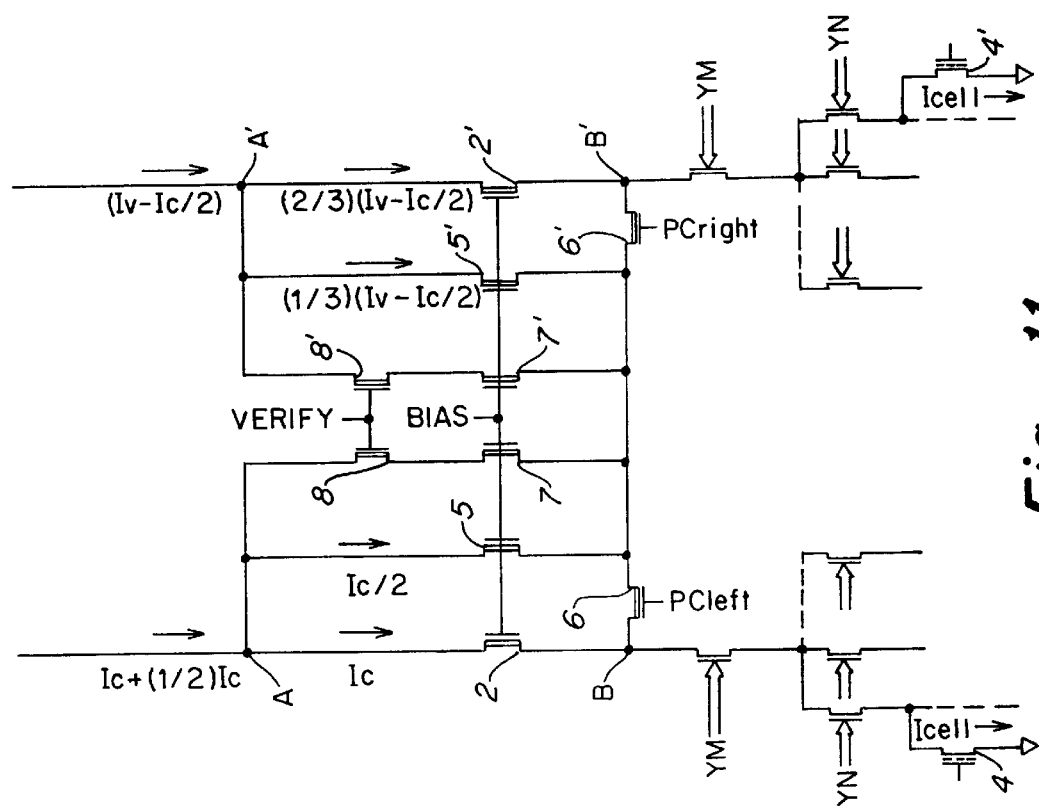
FIG. 11 is a circuit diagram of a variation of the fourth embodiment of the reference system according to the present invention shown in FIG. 10.

Likewise, a fixed bias BIAS can be applied, as shown in FIG. 11, to the fourth embodiment shown in FIG. 10. In the same way, of course, a fixed bias BIAS can also be applied to the third embodiment: this last case is not shown in the figures, since it can be easily deduced from the figures that have already been described. Furthermore, the transistors 2-2', 5-5', 6-6', 7-7', and 8-8', advantageously shown in the various figures as native transistors with a low threshold, can be replaced with high-threshold transistors without altering the inventive concept.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A system for determining a programmed/non-programmed condition of a memory cell, comprising:

a first branch circuit to connect a first load to a matrix of memory cells;

a second branch circuit to connect a second load to at least one virgin reference memory cell in a reference memory matrix;

means for selecting a specific memory cell of said matrix of memory cells;

means for selecting said at least one virgin reference cell;

said first branch circuit having a first enabling transistor to enable a flow of current between said first load and said matrix of memory cells;

said second branch circuit having a second enabling transistor to enable a flow of current between said second load and said at least one virgin reference memory cell;

each of said first and second enabling transistors being controlled, respectively, by a first biasing structure and by a second biasing structure;

at least one transistor to redistribute the current of the first load on said first branch circuit, connected in parallel to said first enabling transistor; and a first equalization transistor controlled by a precharge signal to equalize opposite nodes of said first and second branch circuits, whereby said at least one current redistribution transistor causes a current imbalance in said first and second loads to cause a difference in conductivity between the selected memory cell of said memory matrix and said at least one virgin reference cell, in order to determine the programmed or non-programmed condition of said selected memory cell of the matrix of memory cells.

2. The system according to claim 1, wherein said at least one current redistribution transistor has a size that is K times a size of each of said first and second enabling transistors, where K is a positive variable parameter.

3. The system according to claim 1, wherein said current imbalance at the loads, provided by said at least one current redistribution transistor, occurs with a gain of current at said loads in response to a variation in the current of said selected memory cell.

4. The system according to claim 1, further comprising:
a first current redistribution transistor and a second current redistribution transistor that each have a same size and are coupled in parallel to said first enabling transistor of said first branch circuit.

5. The system according to claim 4, further comprising:
an additional control transistor that is adapted to control activation of said second current redistribution transistor of said first branch circuit.

6. The system according to claim 4, wherein said first and second current redistribution transistors of said first branch circuit have, as a whole, a size that is equal to K times the size of said first enabling transistor of said first branch circuit, where K is a positive variable parameter.

7. The system according to claim 1, further comprising:
at least one transistor to redistribute the current of the second load of said second branch circuit that is connected in parallel to said second enabling transistor of said second branch circuit.

8. The system according to claim 7, further comprising:
a second equalization transistor that is controlled by said precharge signal for the equalization of opposite nodes of said first and second branch circuits, said second equalization transistor being connected between a bit line of said reference memory matrix and the first equalization transistor, said first and second equalization transistors allowing to swap the reference between the first branch circuit and the second branch circuit.

9. The system according to claim 7, wherein a size of said redistribution transistor of said second branch circuit is equal to K times the size of the second enabling transistor of said second branch circuit, where K is a positive variable parameter.

10. The system according to claim 7, further comprising:
a first current redistribution transistor and a second current redistribution transistor, each having a same size, coupled in parallel to the second enabling transistor of said second branch circuit.

11. The system according to claim 10, further comprising:
an additional control transistor to control activation of said second current redistribution transistor of said second branch circuit.

12. The system according to claim 10, wherein said first current redistribution transistor and said second current redistribution transistor have, on the whole, a size that is K times the size of each of the first and second enabling transistors of said first and second branch circuits, where K is a positive variable parameter.

13. The system according to claim 1, wherein said first and second biasing structures each comprises a cascode structure.

14. The system according to claim 1, wherein said first and second biasing structures each comprises a constant bias.

15. The system according to claim 1, further comprising:
means for providing a current differential between currents of said first and second branch circuits.

16. The system according to claim 1, further comprising:
means for providing a voltage differential between voltage values of said first and second branch circuits.

17. The system as recited in claim 1, wherein the memory cells in the matrix of memory cells and the at least one virgin reference cell are each a non-volatile memory cell.

18. A memory, comprising:
a first matrix of a plurality of memory cells;
a second matrix of a plurality of virgin reference memory cells;
first means, coupled to the first matrix, for selecting a first memory cell from the plurality of memory cells;
second means, coupled to the second matrix, for selecting a first virgin reference memory cell from the plurality of virgin reference memory cells;
a first load;
a second load;
a first branch to connect the first load to the first matrix, the first branch including a first transistor to enable current flow from the first load to the first matrix;
a second branch to connect the second load to the second matrix, the second branch including a second transistor to enable current flow from the second load to the second matrix;
a first biasing circuit coupled to the first transistor to control the first transistor;
a second biasing circuit coupled to the second transistor to control the second transistor;
a third transistor, connected in parallel to the first transistor;
a first equalization transistor, coupled between a first node on the first branch and a second node on the second branch, controlled by a precharge signal to equalize the first and second nodes; and
means for comparing a first current from the first load to a second current from the second load whereby a difference therebetween indicates the selected memory cell is programmed.

19. An apparatus for determining a condition of a predetermined memory cell, the apparatus comprising:
a first matrix of memory cells including the predetermined memory cell;
a first multiplexor circuit coupled to the first memory matrix to select the predetermined memory cell;
a first load;

a first enabling transistor, having a size W, coupled to the first load at a first node and to the first memory matrix at a second node;

a second matrix of at least one reference memory cell;

a second multiplexor circuit coupled to the second memory matrix to select the at least one reference memory cell;

a second load;

a second enabling transistor, having a size W, coupled to the second load at a third node and to the second memory matrix at a fourth node;

a first equalization transistor coupled between the second node and the fourth node; and a first redistribution transistor, coupled between the first node and the fourth node, a control terminal of the first redistribution transistor coupled to a control terminal of the first enabling transistor.

20. The apparatus as recited in claim 19, wherein the first redistribution transistor has a size K*W where K is a non-negative number.

21. The apparatus as recited in claim 19, wherein the control terminal of the first redistribution transistor is coupled to a control terminal of the second enabling transistor.

22. The apparatus as recited in claim 19, further comprising:

a second equalization transistor coupled between the fourth node and the second node; and a second redistribution transistor, coupled between the third node and the fourth node, a control terminal of the second redistribution transistor coupled to a control terminal of the second enabling transistor.

23. The apparatus as recited in claim 22, wherein the control terminal of the first redistribution transistor is coupled to the control terminal of the second transistor.

24. The apparatus as recited in claim 22, wherein the second redistribution transistor has a size K*W where K is a non-negative number.

25. The apparatus as recited in claim 19, further comprising:

a first additional transistor having a control terminal coupled to the control terminal of the first redistribution transistor; and a first verification transistor;

wherein the first additional transistor and the first verification transistor are coupled in series to one another between the first node and the fourth node; and wherein a sum of a size of the first redistribution transistor and a size of the first additional transistor is substantially K*W, where K is a non-negative number.

26. The apparatus as recited in claim 25, further comprising:

a differential amplifier having a first input coupled to the first node, a second input coupled to the third node and an output;

wherein the output has a value proportional to a difference between a first voltage at the first node and a second voltage at the third node.

27. The apparatus as recited in claim 25, further comprising:

a second additional transistor having a control terminal coupled to the control terminal of the second redistribution transistor; and a second verification transistor;

wherein the second additional transistor and the second verification transistor are coupled in series to one another between the third node and the second node; and wherein a sum of a size of the second redistribution transistor and a size of the second additional transistor is substantially K*W, where K is a non-negative number.

28. The apparatus as recited in claim 27, wherein a control terminal of the first verification transistor is coupled to a control terminal of the second verification transistor.

29. The apparatus as recited in claim 28, wherein the control terminal of the first additional transistor 7 is coupled to the control terminal of the second additional transistor.

30. The apparatus as recited in claim 28, further comprising:

a differential amplifier having a first input coupled to the first node, a second input coupled to the third node and an output;

wherein the output has a value proportional to a difference between a first voltage at the first node and a second voltage at the third node.

31. A method of determining a programmed/non-programmed condition of a predetermined memory cell in a first matrix of memory cells, the method comprising steps of:

coupling a first current source to the first matrix through a first enabling transistor, the first enabling transistor coupled to the first current source at a first node and to the first matrix at a second node;

coupling a second current source to a second memory matrix through a second enabling transistor, the second enabling transistor coupled to the second current source at a third node and to the second matrix at a fourth node wherein the second matrix includes a virgin reference memory cell;

coupling a first equalization transistor between the second node and the fourth node;

coupling a first redistribution transistor between the first node and the fourth node;

coupling the predetermined memory cell to the second node;

coupling the reference memory cell to the fourth node;

activating the first and second enabling transistors and the first redistribution transistor;

activating the first equalization transistor to equalize the second node and the fourth node;

when the second and fourth nodes have become equalized, deactivating the first equalization transistor;

comparing a first voltage at the first node with a second voltage at the third node; and determining the predetermined memory cell to be non-programmed when the first voltage is substantially equal to the second voltage.

32. The method as recited in claim 31, further comprising steps of:

providing each of the first and second enabling transistors with a size W; and providing the first redistribution transistor with a size K*W, wherein K is a non-negative number.

33. The method as recited in claim 31, further comprising the step of:

coupling a control terminal of the first enabling transistor to a control terminal of the first redistribution transistor.

* * * * *